United States Patent [19]

Vittoz et al.

[11] Patent Number: 4,628,274

[45] Date of Patent: Dec. 9, 1986

[54] AMPLIFIER WITH INPUT DRIFT VOLTAGE COMPENSATION

[75] Inventors: Eric A. Vittoz, Cernier; Henri J. Oguey, Corcelles, both of Switzerland

[73] Assignee: Centre Electronique Horloger S.A., Neuchatel, Switzerland

[21] Appl. No.: 728,883

[22] Filed: Apr. 30, 1985

[30] Foreign Application Priority Data

Apr. 4, 1984 [CH] Switzerland .................... 2179/84

[51] Int. Cl.[4] ............................................. H03F 1/14
[52] U.S. Cl. ......................................... 330/9; 330/51; 330/253
[58] Field of Search ....................... 330/9, 51, 86, 107, 330/253, 255, 277

[56] References Cited

U.S. PATENT DOCUMENTS

| | | | |
|---|---|---|---|
| 3,737,798 | 6/1973 | Faraguet et al. | 330/51 X |
| 4,306,196 | 12/1981 | Dwarakanath et al. | 330/9 |
| 4,431,929 | 2/1984 | Vittoz | 307/490 |

OTHER PUBLICATIONS

Jacob Millman, et al, Integrated Electronics: Analog and Digital Circuits and Systems, 1972 (pp. 501–503).

IEEE Journal of Solid State Circuits, vol. SC-13, No. 3, Jun. 1978, "A mV MOS Comparator", pp. 294–297.
IEEE Journal of Solid-State Circuits, vol. SC-13, No. 4, Aug. 1978, pp. 499–503, "A Low Drift Fully Integrated MOSS-FET Operational Amplifier".
F. Krummenacher, "High Voltage Gain CMOS OTA for Micropower SC Filter", Electronics Letters, vol. 17, No. 4, Feb. 19, 1981.

*Primary Examiner*—Eugene R. LaRoche
*Assistant Examiner*—Steven J. Mottola
*Attorney, Agent, or Firm*—Parkhurst & Oliff

[57] ABSTRACT

The invention concerns an amplifier comprising means for compensating for the input drift voltage. During a preparation phase, the input signal of the amplifier (10) is nullified by short-circuiting the inputs (12) and (13) by means of the change-over switch (30) and the output (15) is connected to a capacitor (40) and to a secondary input (14) of the amplifier. The secondary input has a substantially lower gain than the gain relative to the main input (13), which makes it possible substantially to reduce the effect of charge injection caused by opening of the switch (60). In the amplification phase, the input (13) receives an input signal (V1) and the input drift voltage ($\alpha$V) is compensated by means of the value stored in the capacitor (40).

7 Claims, 6 Drawing Figures

AMPLIFIER WITH INPUT DRIFT VOLTAGE COMPENSATION

TECHNICAL FIELD

The invention relates to an amplifier of MOS construction including means for compensating for the offset of the amplifier input voltage.

BACKGROUND OF THE INVENTION

Means are already known for overcoming the limitations in regard to standard MOS technologies, in particular for compensating for the relatively high level of the input drift voltage of amplifier circuits. The basic principle comprises using a MOS capacitor to store the input drift voltage, and making use of the parameter which is stored in that fashion to correct the information supplied by the amplifier. A first example of use of that principle may be found in the article by Yen S. Yee et al entitled "A 1 mV MOS Comparator", which appeared in the IEEE Journal of Solid-State Circuits, Vol. SC-13, No. 3, June 1978, pages 294–297. A basic circuit diagram of the circuit described in that article is shown in FIG. 1. The input of the amplifier 1 is connected to the input terminal 2 by way of a change-over switch 3 and a capacitor 4, and to the output terminal 5 by way of an on-off switch 6. That circuit operates in two phases. During the memorization or storage phase, the amplifier is connected in a unit gain loop mode by closure of the switch 6 and the change-over switch 3 connects a terminal of the capacitor 4 to earth. In the equilibrium condition, the input drift voltage which appears at the input node 7 of the amplifier is then stored in the capacitor 4. During the amplification phase, the switch 6 is open and the input 2 is connected to the capacitor 4 by way of the switch 3, the voltage stored in the capacitor 4 serving to compensate for the effect of the input drift voltage of the amplifier 1. The major disadvantage of such a compensating method lies in the fact that the on-off switches are formed by means of MOS transistors. Thus, when the transistor which forms the switch 6 is in a non-conducting condition, a part of the channel charge is re-injected at the node 7, which modifies the voltage stored in the capacitor 4, and that modification may be of the same order of magnitude as the input drift voltage which is to be compensated.

A second example of use of the above-mentioned principle is set forth in the article by R. Poujois et al entitled "A Low Drift Fully Integrated MOS-FET Operational Amplifier" which appeared in the above-mentioned IEEE Journal, Vol. SC-13, No. 4, August 1978, pages 499–503. That article provides for the cascade connection of a plurality of amplifier stages coupled by capacitors for storing the value of the input drift voltage of the stage preceding same, multiplied by the gain of that stage. The efficiency of that method increases in proportion to an increasing number of stages, which in itself is a disadvantage. Moreover, it is difficult to ensure stability of an amplifier which is made up of a plurality of stages by means of a negative feedback effect without substantially reducing its band width. If such a method may be applied to the design of a comparator, it is in contrast difficult to apply it to the construction of an operational amplifier.

Thus, an object of the present invention is to provide an amplifier circuit which does not suffer from the above-mentioned disadvantages.

Another object of the invention is to provide an amplifier circuit which includes means for compensating for the input drift voltage.

Yet another object of the invention is to provide an amplifier circuit wherein the charge injection effect, which occurs when on-off switches are opened, is minimized.

The present invention will be better appreciated by means of the following description of particular embodiments, which is set forth purely by way of illustration and with reference to the accompanying drawings in which:

DETAILED DESCRIPTION

Figure 2:
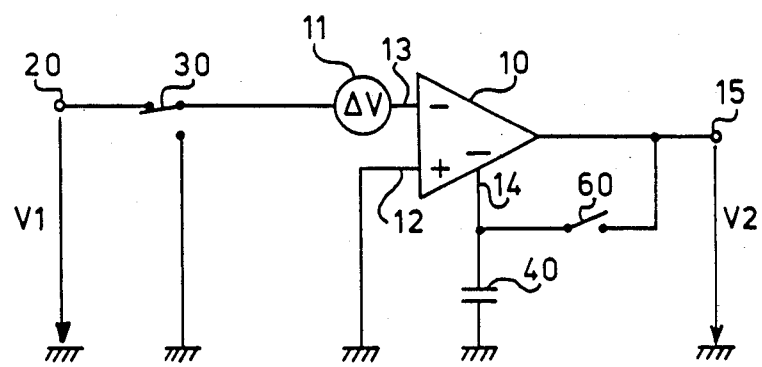
FIG. 2 is a basic diagram of an amplifier according to the invention.

FIG. 2 is a basic circuit diagram of an amplifier circuit according to the invention. It comprises an amplifier 10 having a direct input 12, a first inverted input or main input 13, an output 15 and a second inverted input or secondary input 14. The direct input 12 is connected to earth. The main input 13 may be connected either to the input terminal 20 or earth by means of a change-over switch 30. The secondary input 14 is connected on the one hand to earth by way of a capacitor 40 and on the other hand to the output 15 of the amplifier by way of an on-off switch 60. The element 11 symbolically denotes a voltage source, with a voltage value ΔV, representing the drift voltage of the main input 13 of the amplifier 10. According to the invention, the gain of the amplifier 10 is greater seen from the main input 13 than when seen from the secondary input 14.

The FIG. 2 circuit operates in two successive phases: the compensation phase and the amplification phase.

During the compensation phase, the two inputs 12 and 13 are connected to earth by way of the switch 30 and the secondary input 14 is connected to the output 15 by way of the switch 60. The voltage required to compensate for the effect of the input drift voltage ΔV is stored in the capacitor 40. At the end of the compensation phase, the switch 60 is opened and then the switch 30 is positioned in such a way as to connect the main input 13 to the input terminal 20. If the switch 60 is formed by an MOS transistor, the effect of that transistor being put into a non-conducting condition (opening of the switch 60) is to inject charges into the capacitor 40, thereby modifying the value previously stored therein. However, the effect of such charge injection on the input drift voltage compensation action is reduced in direct proportion to a reduced gain of the amplifier relative to the secondary input, in comparison with the gain of the amplifier relative to the main input.

Figure 3:
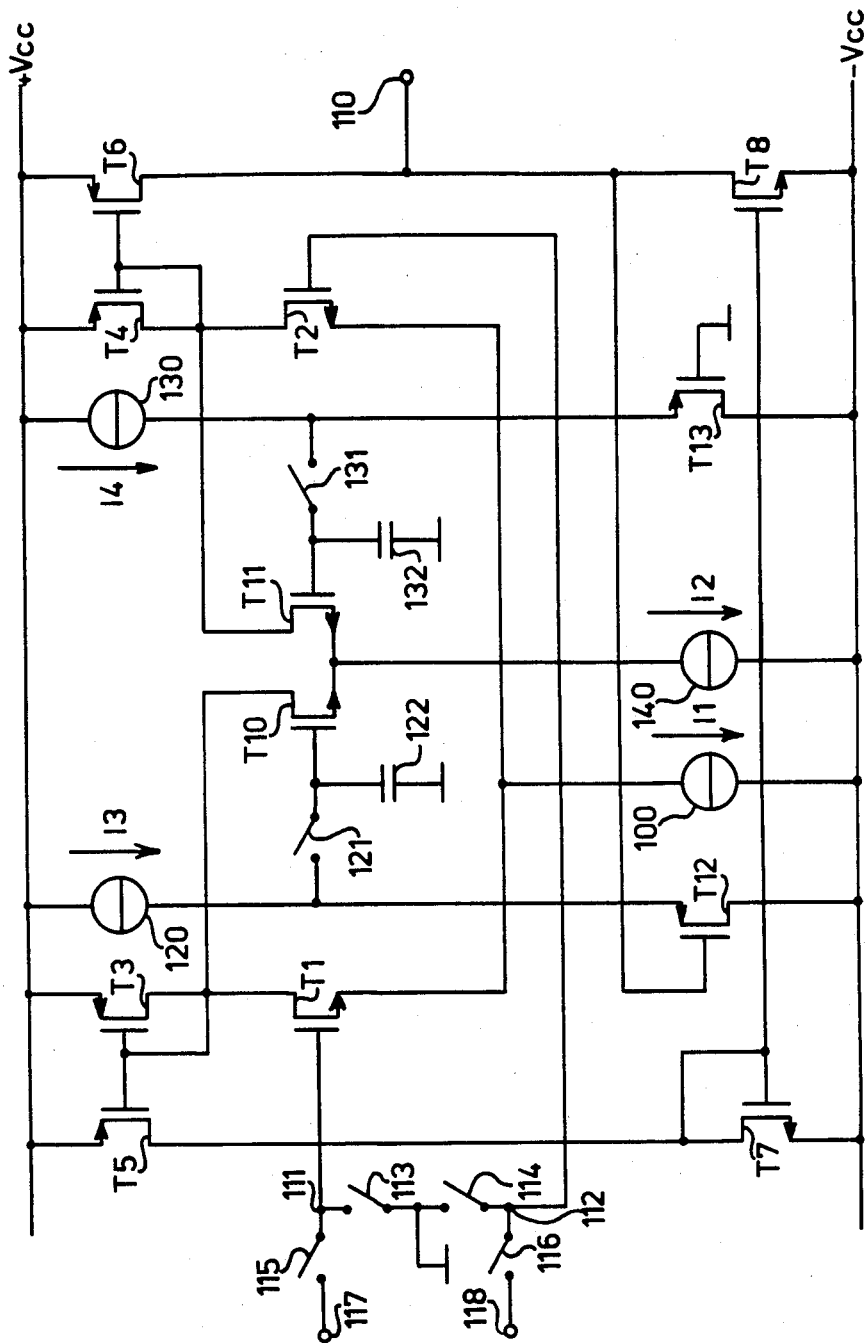
FIG. 3 shows a differential amplifier with linear compensation for input drift voltage.

A first embodiment of the invention of CMOS type is shown in FIG. 3. Shown therein is a differential input pair formed by the n-channel transistors T1 and T2 whose sources are connected to the feed terminal —Vcc of the circuit by way of a current source 100, while their drains are coupled by way of three current mirrors. The three current mirrors are formed by p-channel transistors T3 and T5 whose sources are connected to the feed terminal +Vcc of the circuit, n-channel transistors T7 and T8 whose sources are connected to −Vcc, and p-channel transistors T6 and T4 whose sources are connected to +Vcc. The point which is common to the drains of the transistors T6 and T8 is connected to the terminal 110 which forms the output of the amplifier while the gates of the transistors T1 and T2 are connected to the terminals 111 and 112 which respectively form the inverted main input and the direct input of the amplifier, respectively. Such an amplifier circuit with differential inputs is well known and may be found for example in the article by F. Krummenacher entitled "High Voltage gain CMOS OTA for Micropower SC Filter", which appeared in Electronics Letters, 19th Feb. 1981, Volume 17, No. 4.

According to the invention, on-off switches 113 to 116 are provided on the one hand for connecting each of the inputs 111 and 112 to earth during the compensation phase and on the other hand for connecting the gates of T1 and T2 to the input terminals 117 and 118, respectively, to which the input signals are applied, during the amplification phase. The output 110 is also connected to the gate of a p-channel transistor T12 which is connected in series with a current source 120 between the feed terminals of the circuit and which constitutes a voltage follower stage. The output of the follower stage is connected by way of an on-off switch 121 to a capacitor 122 and to the gate of an n-channel transistor T10. With the transistor T11, the transistor T10 constitutes a differential pair similar to that formed by the transistors T1 and T2. The sources of T10 and T11 are connected to −Vcc by way of a current source 140 while the drains are connected to the drains of T1 and T2, respectively. The elements formed by the transistor T13, the current source 130, the switch 131 and the capacitor 132 are connected symmetrically with respect to the corresponding elements T12, 120, 131 and 132, and the aim thereof is to reduce the effect of a charge injection when the on-off switches are opened, by making the whole of the circuit symmetrical. The gate of the transistor T13 is connected to earth although, in the case of an amplifier with differential inputs and outputs, it could be connected to the other output of the amplifier.

Moreover, although the illustrated circuit provides that the input terminals 111 and 112 are connected to earth during the compensation phase, it may be advantageous for them simply to be connected together during that phase, thus nullifying the input signal.

With regard to capacitors 122 and 132, it will be clear that one of the terminals thereof could be connected to a point at any fixed potential, instead of being connected to earth.

We have seen with reference to FIG. 2 that the gain of the amplifier relative to the main input, which may be denoted by A1, must be higher than the gain relative to the secondary input, which may be denoted by A2. The ratio between those two gains is given by the relationship: $A2/A1 = g_{m2}/g_{m1}$; in which $g_{m1}$ and $g_{m2}$ are the transconductances of the transistors T10 and T1, respectively. That ratio may also be expressed as:

$$\frac{A2}{A1} = \frac{I2}{I1} \cdot \frac{(V_{GS} - V_T)_{T1}}{(V_{GS} - V_T)_{T10}}$$

wherein I1 and I2 are the currents which are respectively supplied by the current sources 100 and 140, $V_{GS}$ is the gate-source voltage of the transistor T1 and the transistor T10, respectively, and $V_T$ is the threshold voltage of the transistor T1 and the transistor T10, respectively. In order for the ratio between the gains, A2/A1, to be low, the ratio between the currents, I2/I1, must be low, and $(V_{GS} - V_T)_{T1}$ must be low with respect to $(V_{GS} - V_T)_{T10}$. In practice, the ratio I2/I1 is limited by the maximum error of the current to be corrected, and the transistors T1 and T10 will be of such a size that the transistor T1 operates at the limit of the low inversion mode (high value of $g_m$) and the difference $V_{GS} - V_T$ of the transistor T10 is as close in value as possible to the feed voltage. All the on-off switches of the circuit are formed by means of MOS transistors.

The mode of operation of the amplifier shown in FIG. 3 is as follows. During the compensation phase, the inputs 111 and 112 are connected to earth by the on-off switches 113 and 114 or are simply connected together, and the gates of the transistors T10 and T11 are connected to the sources of the transistors T12 and T13 by the on-off switches 121 and 131, respectively. The capacitors 122 is then charged up to the voltage of the output 110 which is transferred by the follower stage 120-T12 and which represents the voltage required to compensate for the drift voltage of the main inputs. During the amplification phase, the switches 113, 114, 121 and 131 are open and the inputs 111 and 112 are connected to the input terminals 117 and 118 by way of the switches 115 and 116, respectively. The voltages stored in the capacitors 122 and 132, respectively, cause the transistors T10 and T11, respectively, to conduct to a greater or lesser degree, the effect thereof being to cause a greater or smaller reduction in the current passing through the transistors T1 and T2, respectively.

It will be apparent that the circuit shown in FIG. 3 is only given by way of example of the invention, comprising improved compensation for the input drift voltage, and that many other alternative forms of that circuit may be found, which comply with the principles of the present invention. The circuit shown in FIG. 3 uses compensation of linear type. In fact, there is no need to provide for a linear relationship between the secondary input and the output of the amplifier. A particularly attractive solution comprises using a quadratic compensation characteristic. The diagram in FIG. 4 shows a circuit corresponding to that solution.

Figure 4:
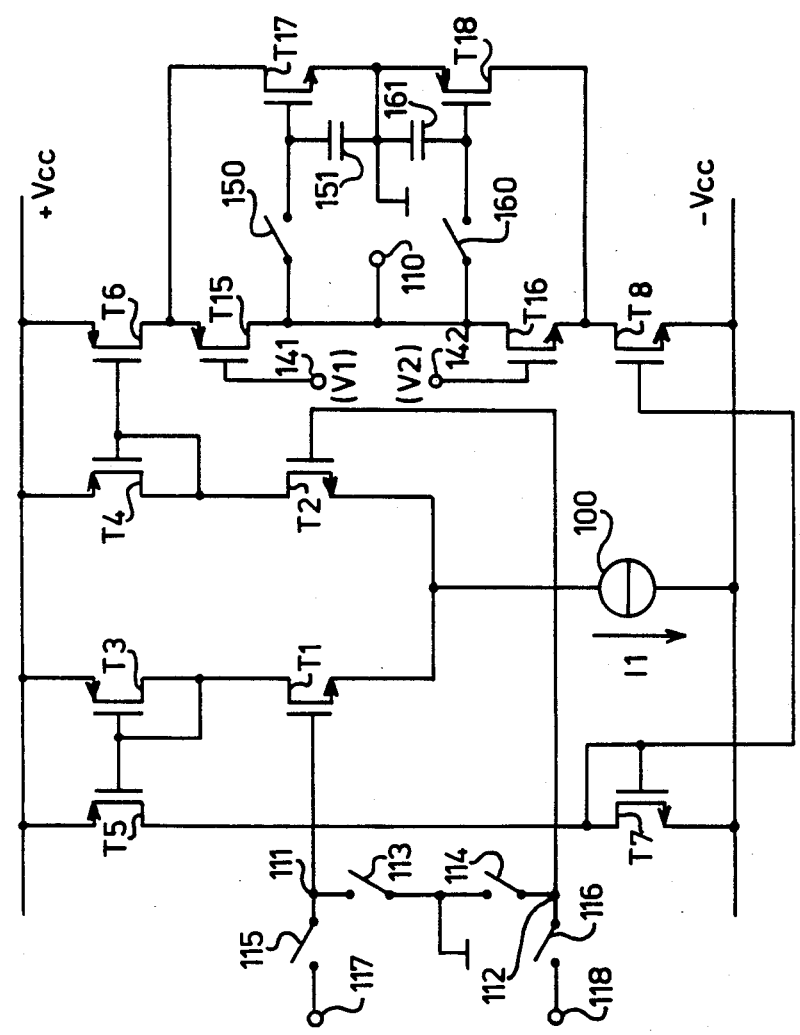
FIG. 4 shows a differential amplifier with quadratic compensation for the input drift voltage.

The circuit shown in FIG. 4 is based on an amplifier having differential inputs, of the same type as that shown in FIG. 3; components which are common to the two circuit diagrams are thus denoted by the same references. In the circuit shown in FIG. 4, the output stage which is formed by the transistors T6 and T8 is completed by an array of cascode type formed by the p-channel transistor T15 and the n-channel transistor T16. The transistors T15 and T16 are connected in series between the transistors T6 and T8 and are biased by applying voltages of suitable values V1 and V2 respectively to the gates 141 and 142. The point which is common to the drains of the transistors T15 and T16 is connected to the output terminal 110 of the amplifier.

Such an arrangement is well known and is described for example in the above-mentioned article by F. Krummenacher.

The compensation circuit comprises two transistors T17 and T18, two capacitors 151 and 161 and two on-off switches 150 and 160. The p-channel transistor T18 is connected between the point common to the transistors T8 and T16 and earth while its gate is connected on the one hand to the capacitor 161 and on the other hand to the output of the amplifier by way of the on-off switch 160. The n-channel transistor T17 is connected between the point which is common to the transistors T6 and T15 and earth while its gate is connected on the one hand to the capacitor 151 and on the other hand to the output of the amplifier by way of the on-off switch 150.

During the compensation phase, the main inputs 111 and 112 of the amplifier are connected to earth or simply connected together, as indicated above with respect to FIG. 3, and the capacitors 151 and 161 are connected to the output of the amplifier by the switches 150 and 160 being closed. The input drift compensating voltage which appears at the output 110 will be stored in the capacitors 151 and 161. During the amplification phase, the inputs 111 and 112 are connected to the input terminals 117 and 118 respectively and the switches 150 and 160 are open. If the voltage for compensation of the drift at the output 110 is positive, compensation will be effected by the transistor T17 which is controlled by the voltage at the terminals of the capacitor 151. If, conversely, the above-mentioned drift compensating voltage is negative, compensation will be effected by the transistor T18 which is controlled by the voltage at the terminals of the capacitor 161.

As in the case of the circuit shown in FIG. 3, the on-off switches are formed by means of MOS transistors. The switch 150 is formed by a p-channel transistor while the switch 160 is formed by a n-channel transistor. If necessary, amplifiers which are disposed in a follower mode may be arranged in series with the switches 150 and 160 in order to accelerate the compensation phase.

Referring to the situation where the drift compensation voltage is positive in value, and using the following symbols to denote the following terms:

$V_S$: the output voltage of the amplifier;
A1: the gain of the amplifier relative to the main input:
$V_E$: the input voltage of the amplifier;
$\Delta V$: the input drift voltage;
$\beta$: the gain of the transistor T17;
$V_G$: the voltage across the terminals of the capacitor 151;
$V_T$: the threshold voltage of the transistor T17; and
$g_m$: the transconductance of the transistor T1 or the transistor T2;

it is possible to show that the output voltage $V_S$ is expressed by the following relationship:

$$V_S = -A1(V_E - \Delta V) - \frac{\beta \cdot A1}{2 g_m} (V_G - V_T)^2$$

That relationship clearly shows a quadratic characteristic in regard to the compensation produced by the circuit shown in FIG. 4.

Figure 5:
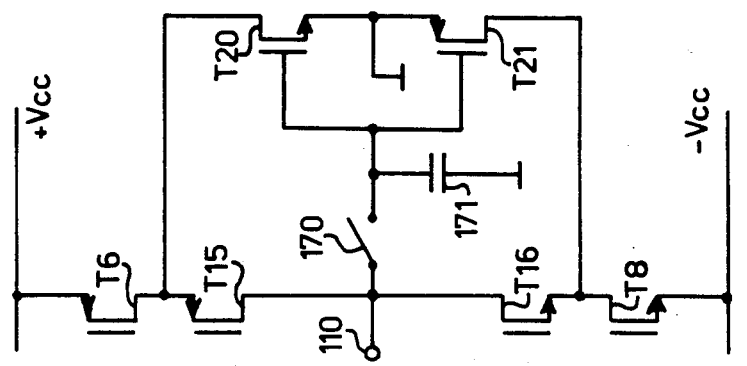
FIG. 5 shows an alternative form of the FIG. 4 circuit.

An alternative form of compensating circuit with a quadratic characteristic is shown in FIG. 5 in which only the output element of the amplifier is illustrated, with all the other elements being identical to those shown in FIG. 4. The n-channel transistor T20 is connected to the point which is common to the transistors T6 and T15, and earth. The p-channel transistor T21 is connected between the point which is common to the transistors T8 and T16, and earth. The gates of the transistors T20 and T21 are connected together and to the capacitor 171 as well as to the output 110 of the amplifier by way of the on-off switch 170. The switch 170 is formed by means of two MOS transistors of complementary types, which are connected in parallel. The mode of operation of the circuit shown in FIG. 5 is similar to that of the circuit shown in FIG. 4, the compensation effect being produced by the transistor T20 or the transistor T21 depending on the sign of the voltage stored in the capacitor 171.

Figure 1:
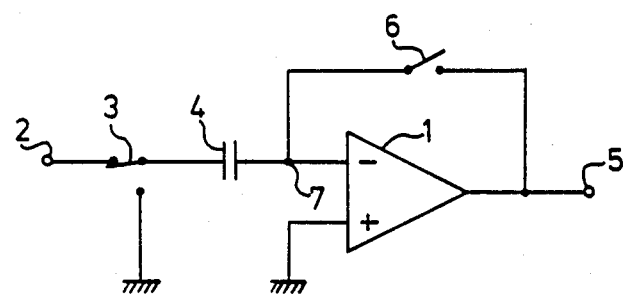
FIG. 1 is a basic diagram of an amplifier which is known in the prior art.
Figure 6:
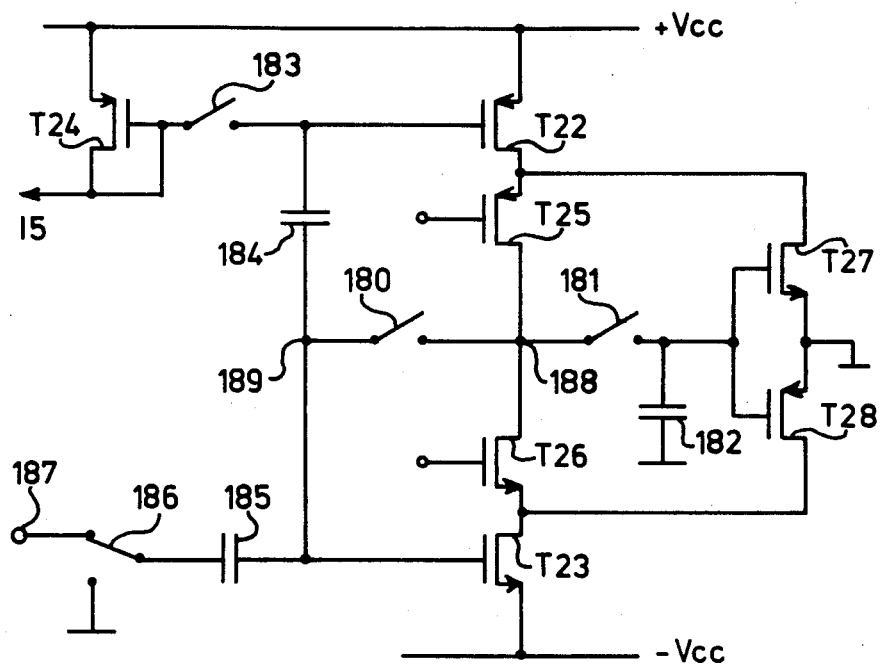
FIG. 6 shows an amplifier of dynamic type, with quadratic compensation for input drift voltage.

When the input drift voltage of the amplifier which is to be compensated is high in value (several hundreds of millivolts), it is advantageous in that case to combine a compensating method which is known in the prior art, as described with reference to FIG. 1, with the compensating method in accordance with the present invention. FIG. 6 shows an embodiment of an amplifier wherein the two compensating methods are combined. The amplifier in FIG. 6 is of dynamic type and is described in the present applicants' U.S. Pat. No. 4,431,929. It comprises a bias voltage source formed by the transistor T24 which is disposed as a diode and which is controlled by a drain current I5, and an amplifier stage formed by the transistors T22 and T23 of complementary types, with which there is associated an array of cascode type, formed by the transistors T25 and T26. The node 189 which forms the input node of the amplifier is connected to the gate of the transistor T23, to the gate of the transistor T22 by way of a capacitor 184, and to the input terminal 187 by way of a capacitor 185 and a change-over switch 186. The input node 189 is connected to the output node 188 by an on-off switch 180. The mode of operation of that amplifier will be briefly recalled here. During the preparation phase, the switch 186 is connected to earth and the switches 180 and 183 are closed. The capacitors are then charged up to a value which will bias the transistors T22 and T23. The transistors T25 and T26 are biased in known fashion by voltages applied to their gates. During the amplification phase, the switches 180 and 183 are opened and the switch 186 is connected to the signal input terminal 187. When they open, the switches 180 and 183 inject a parasitic charge into the capacitors 184 and 185. In accordance with the invention, that parasitic effect can be compensated by means of a compensating circuit which is identical to that described with reference to FIG. 5 and which comprises the switch 181, the capacitor 182 and the transistors T27 and T28 of complementary types. When it is associated with the compensating circuit according to the invention, the mode of operation of the dynamic amplifier is as follows. During the preparation phase, the switch 181 is open, the switches 180 and 183 are closed and the switch 186 connects the capacitor 185 to earth. The switch 181 is then closed while the switches 180 and 183 are opened. Finally, the switch 186 connects the capacitor 185 to the input terminal 187 for the amplification phase.

Although the present invention has been described by means of particular embodiments, it will be appreciated that the invention may be the subject of modifications or variations without thereby departing from the scope thereof.

I claim:

1. An amplifier having at least one main input, an output and means for nullifying, during a compensation phase, the signal which is applied to said main input, said amplifier having a first gain value between said at least one main input and said output, said amplifier comprising:

at least one secondary input having a substantially lower gain value between said at least one secondary input and said output, than said first gain value;

a capacitor connected between a point which is common to said secondary input and a point at a fixed potential;

switch means which are disposed between the output of the amplifier and the point which is common to said capacitor and to said secondary input and which permit the voltage level of the output of the amplifier to be stored in said capacitor during said compensation phase; and compensation means which are controlled by said stored voltage level to compensate for the effect of the drift voltage of said main input.

2. An amplifier according to claim 1 wherein said compensation means comprise a circuit having a linear transfer characteristic between said secondary input and said output.

3. An amplifier according to claim 1 wherein said compensation means comprises a circuit having a quadratic transfer characteristic between said secondary input and said output.

4. An amplifier having at least one main input, an output, a first capacitor in series with said main input, means for connecting said first capacitor to a reference voltage during a compensation phase and a switch device for connecting said main input to said output during the compensation phase; said amplifier having a first gain value between said at least one input and said output, said amplifier comprising:

at least one secondary input having a substantially lower gain value between said secondary input and said output, than said first gain value;

a capacitor connected between a point which is common to said secondary input and a point at a fixed potential;

switch means disposed between the output of the amplifier and the point which is common to said capacitor and to said secondary input and which permit the voltage level of the output of the amplifier to be stored in said capacitor during said compensation phase; and compensation means which is controlled by said stored voltage level to compensate for the effect of the residual drift voltage of said main input and the effect of opening of said switch device.

5. An amplifier according to claim 4 wherein said compensation means comprises a circuit having a linear transfer characteristic between said secondary input and said output.

6. An amplifier according to claim 4 wherein said compensation means comprises a circuit having a quadractic transfer characteristic between said secondary input and said output.

7. An amplifier circuit comprising:

an output;

a first input, said amplifier having a first gain between said first input and said output;

a second input, said amplifier having a second gain, substantially less than said first gain, between said second input and said output;

a capacitor having a first terminal connected to said second input and a second terminal connectable to a fixed potential; and switch means operable whereby, during a compensation phase, said first input is connectable to said fixed potential and said second input is connected to said output, and whereby, in an amplification phase, said first input is connectable to an input voltage and said second input is disconnected from said output.

* * * * *